United States Patent [19]

Underhill

[11] Patent Number: 4,746,870
[45] Date of Patent: May 24, 1988

[54] WIDE RANGE FREQUENCY SYNTHESIZER WITH REDUCED JITTER

[75] Inventor: Michael J. Underhill, Faygate, United Kingdom

[73] Assignee: U.S. Philips Corporation, New York, N.Y.

[21] Appl. No.: 65,631

[22] Filed: Jun. 23, 1987

Related U.S. Application Data

[63] Continuation of Ser. No. 920,491, Oct. 17, 1986, abandoned, which is a continuation of Ser. No. 461,805, Jan. 28, 1983, abandoned.

[30] Foreign Application Priority Data

Mar. 19, 1982 [GB] United Kingdom ................. 8208096

[51] Int. Cl.$^4$ .................... H03L 7/18; H03B 19/00
[52] U.S. Cl. ...................................... 328/14; 331/1 A; 307/511
[58] Field of Search .............. 331/1 A; 328/14, 15; 307/511, 527, 525; 375/108, 120

[56] References Cited

U.S. PATENT DOCUMENTS

| | | | |
|---|---|---|---|
| 3,976,945 | 9/1976 | Cox | 328/14 |
| 4,410,954 | 10/1983 | Wheatley, III | 364/701 |
| 4,536,718 | 8/1985 | Underhill | 331/16 |
| 4,602,219 | 7/1986 | Underhill et al. | 331/16 |

FOREIGN PATENT DOCUMENTS

| | | |
|---|---|---|
| 1447418 | 8/1976 | United Kingdom . |
| 2026268 | 1/1980 | United Kingdom . |
| 2062315 | 5/1980 | United Kingdom . |
| 2068185A | 8/1981 | United Kingdom . |

Primary Examiner—Stanley D. Miller
Assistant Examiner—Richard Roseen
Attorney, Agent, or Firm—David R. Treacy

[57] ABSTRACT

A frequency synthesizer of the type having a reference frequency source CPG, frequency reduction means PS which cancels pulses from a frequency to be reduced and a jitter compensation signal circuit arranged to compensate for any jitter in the output frequency that would otherwise be caused by each cancelled cycle. The jitter compensation signal is derived from a jitter-containing pulse train via a d.c. removal circuit DGR and an integrator INT. Additionally, a perturbation signal is injected by a control device CD which causes pulses to be added to and also to be subtracted, by PA and PS respectively, from the frequency to be reduced, the jitter caused by this addition and subtraction also being compensated for by the compensation signal circuit.

15 Claims, 1 Drawing Sheet

WIDE RANGE FREQUENCY SYNTHESIZER WITH REDUCED JITTER

This is a continuation of application Ser. No. 920,491, filed Oct. 17, 1986, which is a continuation of application Ser. No. 461,805, filed Jan. 28, 1983, not both abandoned.

BACKGROUND OF THE INVENTION

This invention relates to a frequency synthesizer comprising a reference frequency generator, a frequency control circuit which includes a variable frequency reduction means having a cycle cancellation circuit which is arranged to cancel a cycle of the frequency to be reduced by the reduction means for each input pulse to said cancellation circuit from a pulse source, and a jitter compensation signal circuit connected to the frequency control circuit, the output signal of the jitter compensation signal circuit being arranged, at least partly, for any jitter in the period of the output frequency that would otherwise be caused by each cancelled cycle.

Such frequency synthesizers are known and are either of the "direct" type in which the output frequency is derived directly from the reference frequency or of the indirect, or phase lock loop, type in which the output frequency is generated by a variable frequency oscillator forming part of a phase lock loop which locks the oscillator to a predetermined rational fraction, which is to be understood as including a multiple, of the reference frequency.

Examples of direct frequency synthesizers are described in U.K. Patent Specification Nos. 1,545,953 and 2,062,315, and examples of phase lock loop synthesizers are described in U.K. Patent Specification Nos. 1,447,418 and 2,068,185A. In each type, it is known to include in the frequency reduction means a variable modulus divider to provide the major part of the required frequency reduction. Such dividers generally produce spectrally pure frequencies which are exact subharmonics of the frequency which is to be divided. The frequencies other than subharmonics are produced by a cycle cancellation technique in which selected cycles of the frequency to be reduced are cancelled. Such a technique is well known and is alternatively referred to as sidestep programming (see, for example, A. F. Evers and D. J. Martin, "Improved forms of digital frequency synthesizers", IEE Colloquium Digest 1972/11, pp. 9/1 to 9/5), pulse blanking, pulse removal, pulse cancellation, and pulse or cycle swallowing. The technique is also described in Mullard Technical Note 142 "Versatile LSI frequency synthesiser" pp. 8, 9.

For example, a frequency synthesizer may have a range of 1.6 MHz to 30 MHz adjustable by means of one or more modulo-N dividers where N is adjustable to provide the range in 1 kHz steps. These steps may then be further subdivided by the use of a rate, or fractional, multiplier which, for example, produces an output frequency variation of 0 to 990 Hz in 10 Hz fractional steps. In this manner, the whole range 1.6 MHz to 30 MHz is covered in 10 Hz fractional steps. The adjustable frequency given by these fractional steps is usually referred to as the offset frequency and is provided by means of a cycle cancellation circuit controlled by the output of the rate multiplier which constitutes the above-mentioned pulse source.

In the prior art devices, the pulse source derives the cycle-cancelling pulses from the reference frequency or from the variable frequency oscillator, typically by means of at least a programmable rate multiplier which produces a programmable number of output pulses for a fixed number of input pulses. These output pulses have an average frequency which can be any rational fraction of the frequency from which they are derived. Since they are strobed by the input pulses, however, the periods between successive output pulses will frequently vary due to the missing pulses and these variations (referred to as "jitter") will produce variations in the output frequency unless a compensation circuit is provided to reduce the effects of the jitter.

In the frequency synthesizer described in the abovementioned mentioned U.K. Patent Specification No. 1,447,418, the frequency reduction is partly effected by a successive addition rate multiplier which, for each input pulse thereto, adds a programmable increment to an accumulated value and gives an output pulse each time the capacity of the accumulator is exceeded, leaving the excess as a residue in the accumulator. The principle of its operation can readily be appreciated by taking a simple example in which the capacity of the accumulator is unity and each input pulse adds 0.7 to the value in the accumulator. Thus the accumulator overflows and gives an output pulse for the 2nd, 3rd, 5th, 6th, 8th, 9th and 10th input pulses—i.e. seven output pulses for ten input pulses. In other words, the average pulse repetition rate has been multiplied by 0.7 by the rate multiplier. The patent specification describes a phase lock loop system in which the residue in the accumulator is converted to analog form in a digital-to-analog converter and the resultant analog signal is used to compensate for any variation in the output of a phase comparator, in the phase lock loop, due to jitter.

If there is any residual imbalance in the jitter compensation arrangement, this imbalance appears in the output frequency as a spurious discrete sideband signal. This signal may typically be 30 dB down with respect to the main output signal and, while this is adequate in the audio pass band in communication receivers, it is not adequate for broadcast receivers. If, for example, the output frequency is 100 kHz and the offset frequency is 12.5 kHz, any spurious signal would be in the adjacent channel, whereas the specification for such equipment requires the level of any such signal to be at least 90 dB down. One object of the invention is at least to mitigate this problem.

In known frequency synthesizers, the compensation signal, which effectively predicts any jitter, is derived from the circuitry of, or associated with, the rate multiplier, or at least depends upon the "history" of the pulses which cause the cycle cancellation, in order to provide the predictive compensation signal. The relevant circuitry involved is fairly complex. A further object of the invention is to provide a frequency synthesizer of the type defined in the opening paragraph hereof which enables the electronic hardware to be reduced, provides improved sideband suppression, and enables any pulse source to be used.

The above-mentioned U.K. Patent Specification No. 2,068,185A describes a frequency synthesizer of the type including a feedback system which includes a detector arranged to detect any residual jitter in the circuit after application of the compensation signal, and a variable gain amplifier arranged to control the amplitude of the compensation signal, the gain of the amplifier being controlled by the detector to reduce any said residual jitter. In this manner, the detector and amplifier from part of a feedback loop which adjusts the amplitude of the compensation signal in dependence upon the detected residual jitter in order to minimize that jitter.

The frequency synthesizer described in the above-mentioned U.K. Patent Specification No. 2,068,185A employs such a feedback system. However after a frequency step change in which the offset frequency step size is a small fraction of the main step size, the system may take some time to settle. This time, although adequate for may purposes, may be too long for the frequency synthesizer to be used, for example, in frequency-hopping radio systems or as a microwave synthesizer. The reason for this delay in the settling time can be explained by taking the example referred to above in which the main step size is 1 kHz and the offset frequency is adjustable in 10 Hz steps. The fractional step is thus 0.01 and the system receives information at the 10 Hz rate; that is to say that in the worst case the system may have to wait for the one-tenth of a second before it senses whether or not the system has any residual imbalance. For this reason it is necessary to include a time constant of this order in the feedback loop to ensure satisfactory operation under the worst case conditions where the offset frequency is 10 Hz or 990 Hz. Yet a further object of the invention is to enable this time constant to be substantially reduced in frequency synthesizers provided with a feedback control loop.

SUMMARY OF THE INVENTION

According to the invention, it provides a frequency synthesizer of the type comprising a reference frequency generator; a frequency control circuit which includes a variable frequency reduction means having a cycle cancellation circuit which is arranged to cancel a cycle of the frequency to be reduced by the reduction means for each input pulse to said cancellation circuit from a pulse source; and a jitter compensation circuit connected to the frequency control circuit, the output signal of the jitter compensation signal circuit being arranged to compensate, at least partly, for any jitter in the period of the output frequency of the synthesizer that would otherwise be caused as a result of each cancelled cycle, is characterized in that the jitter compensation signal circuit comprises a d.c. removal circuit followed by an analog integrator, and in that the synthesizer further includes a control device, a control signal output of which is arranged to cause the frequency control circuit to cancel further cycles from, and also to add cycles to, the frequency to be reduced in a given sequence, and a control signal compensation circuit which is connected to the control device and is arranged to compensate for any jitter in the output frequency of the synthesizer that would otherwise be caused by the control signal.

A frequency synthesizer according to the invention has the advantages that any pulse source may be used to provide the frequency offset, and that the jitter compensation signal, which in effect predicts the phase jitter, is derived by d.c. removal and analog integration of any pulse train containing jitter caused by the source. In known frequency synthesizers of the so-called "phase predict" type in which a jitter compensation signal is generated, the compensation signal circuit uses digital techniques and generally includes a digital-to-analog converter. In the practical implementation of these techniques, it is not possible to get the various analog step sizes identical over the whole signal range required. As a result, spurious sideband noise is produced at a level of about 30 dB down with respect to the output signal level. Using direct analog integration, however, no conversion errors are produced after gain balancing and the sideband noise level is reduced by a further 20 to 30 dB.

Thus, a synthesizer according to the invention not only provides a remarkable improvement in sideband rejection but also very considerably reduces the circuit complexity. It is in fact the case that the jitter compensation circuit can be connected to substantially any point in the synthesiser circuit at which a pulse train appears which contains jitter and may, for example, be connected to the input or to the output of the cycle cancellation circuit. In the former case, the compensation signal is derived from the pulses which cause the cycle cancellation whereas in the latter case it is derived from a pulse train from which the cycles have been cancelled.

For present purposes, the d.c. removal circuit referred to above is to be understood as including not only d.c. blocking circuits by also circuits which compensate for or nullify any effect the d.c. may have. Thus, while the presence of d.c. in the signal applied to the integrator could cause the latter to saturate, the effect of the d.c. can be compensated for or nullified in a manner described, for example, in United Kingdom Patent Specification No. 2,074,421A.

The jitter compensation signal circuit may include an amplifier the gain of which is inversely proportional to the output frequency of the synthesiser. This not only ensures that the level of the compensation signal is correct but also that any variation in the output signal due to large frequency changes in the output frequency of the synthesizer is precisely compensated for.

In addition to the reduction of the level of the sideband noise by the use of the d.c. removal circuit and analog integrator, a very significant reduction in the level of any spurious discrete sideband signal is achieved by the above-mentioned addition and subtraction of cycles. As referred to above, any residual imbalance in the jitter compensation circuit would give rise to a spurious sideband signal having a discrete frequency determined by the offset frequency. The effect of adding and subtracting pulses is to introduce a perturbation signal into the system. In the event of any residual imbalance in the compensation circuit, the engergy in the spurious discrete signal is mixed with the perturbation signal and is spread over a wide spectrum with the result that it appears as noise at a considerably lower level. The result of this double noise reduction is that the synthesiser can be used in broadcast systems, etc.

In frequency synthesizers having a feedback control loop, which detects the sign or phase of any residual imbalance in the system and uses this imbalance to control the gain of the compensation signal or signals in such a direction as to reduce the imbalance, the imbalance signals caused by the added and subtracted pulses implies that the loop receives information at a much higher minimum rate. Thus, the time constant can be considerably shortened and this makes the response of the synthesizer to changes in the required frequency far more rapid, with the result that the utility of the synthesizer is considerably extended.

It is not essential for the control device to be arranged to add the same number of cycles as it cancels—any difference between the numbers merely represents a frequency offset. Preferably, however, the number of added cycles is substantially the same as the number of cancelled cycles in any given period, since substantially no frequency offset is then caused.

The control signal output of the control device may have three states—namely a first state which causes a pulse to be cancelled, a second (neutral) state which causes no pulse addition or cancellation, and a third state which causes a pulse to be added.

The control signal may comprise at least first and second interspersed pulse sequences, the arrangement being such that each pulse of the first sequence causes a cycle to be cancelled from, and each pulse in the second sequence causes a cycle to be added to, the frequency to be reduced. By interspersing the sequences, the instantaneous frequency of the frequency to be reduced is, at any instant, closer to its average frequency than would be the case if a long series of cancelled pulses were followed by a long series of corresponding added pulses. The minimum instantaneous deviation from the average frequency is given if the pulses of the two sequences are arranged alternately. A considerable advantage accrues, however, if the two pulse sequences are interspersed and occur in a random manner. Any phase jitter energy in the output frequency caused by any residual imbalance in the compensation signals is then made completely noise-like and is spread over such a wide spectrum that it is substantially undetectable. Substantially the same spreading effect can be achieved, but in a more convenient practical manner, if the two sequences together form a pseudo-random sequence since such sequences may easily be generated in well known manner.

In order to minimize the amount of jitter resulting from the control signal, the latter may be in Manchester-coded form or may be a differentiated code signal. In this context, differentiation means converting a rising transition of a clocked input signal to a $+1$ outputs signal, a falling transition to a $-1$ output signal, and the lack of a transition to a 0.

The synthesizer may include means for combining the outputs of the jitter and control signal compensation circuits to form a combined compensation signal. Thus, only a single correction signal need by applied to the jitter correction arrangement, for example a phase modulator or a programmable delay generator. Although the principle of operation of a phase modulator in this art is usually different from that of a programmable delay generator, the effect of each for present purposes is substantially the same.

The frequency synthesizer may include a detector arranged to detect any residual jitter in the circuit after application of the combined compensation signal, and a variable gain amplifier arranged to control the amplitude of the combined compensation signal, the gain of the amplifier being controlled by the detector to reduce any said residual jitter. In this manner the detector and amplifier form part of a feedback loop, referred to above, which adjusts the amplitude of the compensation signal in dependence upon the detected residual jitter in order to minimize that jitter.

DESCRIPTION OF THE DRAWING

Embodiments of the invention will be described, by way of example, with reference to the accompanying drawing.

DESCRIPTION OF THE PREFERRED EMBODIMENTS

Figure 1:
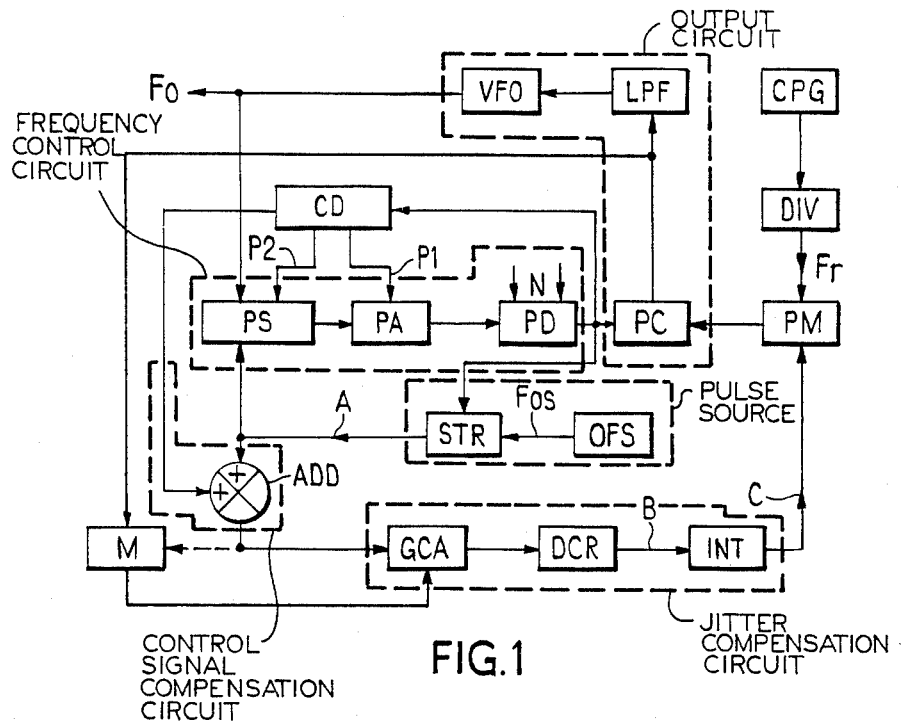
FIG. 1 is a block schematic circuit diagram of a frequency synthesizer of the phase lock loop type.
Figure 2:
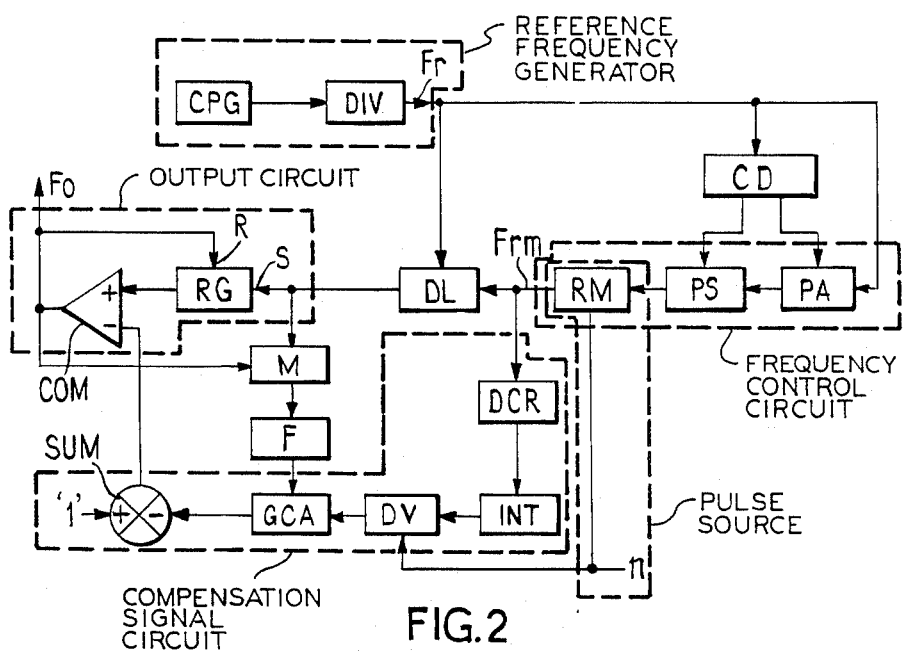
FIG. 2 is a block schematic circuit diagram of a frequency synthesizer of the direct type.

FIG. 1 shows a block schematic diagram of a first embodiment of the invention comprising an output circuit formed by a voltage-controlled variable frequency oscillator VFO, the output of which constitutes the synthesizer output (frequency Fo) and is connected to one input of a pulse (cycle) swallow circuit PS. The output of circuit PS is connected via a pulse (cycle) adder PA to a programmable divider PD which divides by an adjustable number $N>1$. The output of divider PD is connected to a first comparison input of a phase comparator PC and also to the strobe input of a strobing circuit STR. The other input of circuit STR is connected to the output of an offset frequency source OFS having a variable offset frequency Fos in a range which is low relative to the output frequency range of the synthesizer. For example, the synthesizer may have an output frequency range of 1.6 MHz to 30 MHz adjustable by divider PD in 1 kHz steps and the variable offset frequency source OFS may have a range of 0 to 990 Hz variable in 10 Hz steps. The source OFS may, for example, derive the offset frequency from a clock pulse generator CPG or from the output of divider PD, the connections thereto not being shown in the Figure. Thus, for example, the source OFS may comprise a rate multiplier and a divider as shown at RM and D1, respectively, in FIG. 3 of U.K. Patent Specification No. 1,447,418 or may simply comprise a rate multiplier R as shown in FIG. 2 of that specification. The offset frequency source may, alternatively, generate an offset frequency directly in response to an analog or a digital input. There are of course many ways in which such an offset frequency may be provided—all that is required is that the range of the output frequency Fos of the source is low compared with the frequency range of the synthesizer since the controllable increments of frequency Fos establish the smallest frequency step of the synthesizer.

The output of strobing circuit STR thus is a pulse source having an average frequency equal to the offset frequency, and is connected to the "swallow" command input of pulse swallow or cycle cancellation circuit PS and also to the input of a d.c. removal circuit DCR through an adder ADD and a gain-controlled amplifier GCA. The output of the circuit DCR is fed through an analog integrator INT to the phase control input of a phase modulator PM. The clock pulse generator CPG provides pulses having a high stable repetition rate (frequency) and the frequency of these pulses is, if required, divided in a divider DIV to provide a reference frequency Fr (e.g. 1000 p.p.s.) which is fed by the phase modulator PM to a second comparison input of phase comparator PC. The output signal from comparator PC is fed to the frequency control input of oscillator VFO by a low-pass loop filter LPF.

The operation of the phase lock loop control circuit VFO-PS-PD-PC-LPF-VFO is well known and is described in terms of these referenced items in the above-mentioned U.K. Patent Specification No. 1,447,418. Briefly, the output signal of comparator PC is integrated in a low-pass filter LPF and adjusts the frequency of the oscillator VFO until the phase of the signal fed to the first comparison input of comparator PC from divider PD is identical to the phase of the signal fed to the second comparison input of the comparator PC by phase modulator PM. If the relative phase of the two input signals to comparator PC tend to differ slightly, then the output signal of comparator PC changes accordingly in such a direction that the phase of oscillator VFO is shifted to reduce the phase difference between the two input signal to comparator PC to zero.

The remainder of the circuit differs from the prior art and its operation will therefore be described in more detail. Output pulses from the source OFS, having an average frequency Fos, are strobed in circuit STR by the output pulses of divider PD to produce output pulses of the defined length. These pulses of defined length operate circuit PS in precisely the same manner as the corresponding pulses $F_R$ in FIG. 2 of said Patent Specification No. 1,447,418 and offset the output frequency Fo by Fos. Thus, Fos may be selected to give a very fine control of the output frequency Fo. These pulses form a pulse signal A which, ignoring for a moment any effect of adder ADD and amplifier GCA, is applied to the d.c. removal circuit DCR which either removes any d.c. component in the pulse signal (e.g. by a series capacitor) or compensates for any saturation effect the d.c. may give rise to in the integrator INT. A particularly suitable compensation method is described in Patent Specification No. 2,074,421A. The resulting signal B is integrated by the analog integrator INT to produce a signal C which is used to control the phase delay generated by phase modulator PM.

As described above, the operation of the circuit PS in response to the strobed pulse signal A causes jitter in the pulses appearing at the output of divider PD, this jitter appearing as a phase delay in the pulses each time circuit PS is caused to swallow (i.e. cancel or subtract) a pulse by the arrival of a pulse in signal A. This same pulse is used, through the circuit elements DCR and INT which are part of a jitter compensation circuit, to cause a corresponding phase delay in the pulse from phase modulator PM. Thus, the pulse from modulator PM to comparator PC is delayed to substantially the same extent as the jitter delay in the corresponding pulse from divider PD. Thus, the effects of jitter on the output frequency Fo of oscillator VFO are, at least, substantially reduced.

In effect, the signal C has a value which predicts any phase delay resulting from jitter and compensates for this delay accordingly. As would be expected, as the offset frequency Fos is increased, so the amount of jitter per unit of time increases and the value of the jitter-compensating signal C increases. The average value of the signal B is zero, due to the removal of the d.c. content, and hence the signal C is a function of the amount of jitter caused by the pulse swallowing technique. The function of gain-controlled amplifier GCA will be described below.

While the amplifier GCA is shown preceding the removal circuit DCR, it will be evident to those skilled in the art that it may be located anywhere in the series circuit ADD-DCR-INT-PM.

From the above, it can be appreciated that the phase correction signals are derived in a very simple manner directly from the phase jitter actually caused by the offset frequency source OFS. Further, the correction steps are derived by analog integration—in contradistinction to known systems which are based on digital means—with the result that the correction signal does not suffer from the discontinuities which can be introduced by inaccuracies of practical digital-to-analog converters which occur in known phase prediction methods. Thus, a reduction in the system noise is achieved.

The circuit further includes a control device CD fed with synchronizing pulses from the output of divider PD. Circuit blocks PS, PA, and PD form a frequency control circuit to which control device CD is connected in order to provide a control signal thereto comprising two interspersed sequences of pulses P1 and P2. Each P1 pulse causes adder PA to add a pulse (cycle) to the frequency Fo and each P2 pulse causes pulse swallow circuit PS to cancel a pulse. Preferably, a substantially equal number of P1 and P2 pulses are generated such that, over a time average, there is no net phase error introduced as a result of the control signal and so the process generates no frequency error in the system.

Control device CD also provides a combined control signal to an input of adder ADD, the combined signal comprising a $+1$ pulse for each P1 pulse and a $-1$ pulse for each P2 pulse. Thus this input to adder ADD is part of a control signal compensation circuit. The amplitude of these pulses is adjusted by the gain-controlled amplifier GCA and, after d.c. removal by circuit DCR and integration by integrator INT, form a compensation signal which controls phase modulator PM in such a manner that the effects of the jitter at the output of divider PD are precisely matched by a corresponding jitter in the output of phase modulator PM.

As explained above, in a corresponding frequency synthesizer not provided with control device CD, pulse adder PA, and adder ADD, the jitter information in signal B can have a relatively low frequency, for example 10 Hz, and, as a result, a time constant has to be provided in the compensation signal path of one-tenth of a second or greater. Thus, the settling time of the synthesiser to a change in required frequency Fo is one-tenth of a second, which may be too long for some applications. The provision of control device CD, however, causes a "perturbation" signal to be added to the compensation signal by adder ADD with the result that the information in the compensation signal has a considerably higher repetition rate. The response time of the compensation signal path can, therefore, by made considerably shorter, thereby considerably extending the possible fields of use of the synthesizer.

Another advantage is that the energy in any spurious discrete sideband signal which may appear in the output frequency Fo due to any imbalance in the compensation circuit is spread over a wide frequency spectrum by the residual perturbation signal appearing in the output as a result of the same imbalance. In this manner, any said imbalance will only produce noise in the output signal at such a low level that it is relatively undetectable.

As is well known, the pulse swallow circuit PS might comprise a so-called $n/(n+1)$ prescaler which divides by n (e.g. 10) in the absence of a pulse in signal A and by $(n+1)$ if a control pulse is present. In a similar manner, pulse adding circuit PA may comprise an $n/(n-1)$ prescaler. Alternatively, the pulse adder PA may comprise a divide-by-two circuit, for example forming the first stage of divider PD, which normally divides by 2 but which divides by 1 for each P1 pulse. Alternatively, the functions of circuits PS, PA, and PD can be performed by a modulo-$(n-1)/n/(n+1)$ divider as described in the specification of GB Patent Application No. 2,074,421A.

In principle, the $+1$ and $-1$ pulses could be interspersed with 0 periods in which the effective division ratio of the divider arrangement is $n_1$, but then the compensation signal fed to adder ADD would include information which apparently serves no useful purpose. However, in order to improve the noise-like nature of the compensation signal, it may be advantageous to include a number of 0 periods.

The control signal from control device CD which would give the maximum rate of information would be alternate $+1$ and $-1$ pulses occurring at the reference frequency $F_R$, giving a square wave of frequency $F_R/2$. The combined signal is, however, preferably derived from or forms a random or pseudo-random binary sequence which is then Manchester-coded (encoded in pairs of $(+1, -1)$ or $(-1, +1)$ depending upon the presence of a 0 or 1, respectively, in the sequence) or is differentiated. In some circumstances it may be advantageous to differentiate the Manchester-coded signal. The random sequence has to be generated at a maximum rate of $F_R$ and, if it has a total period of T, then its spectrum will be noise-like but with discrete components spaced by frequency $T^{-1}$. If T is less than about 100 mS for a typical communication synthesizer, the spectrum can be considered as pure noise. In this case any energy in the output frequency resulting from imbalance in the compensation system will not appear as a discrete signal but will be spread out as noise spectrum signal. In this manner, the total imbalance energy can be up to 30 dB greater than the maximum imbalance energy that would be tolerable without this spreading action and yet still be inaudible. The following example will serve to illustrate this.

The frequency synthesizer may be used in connection with a multi-channel communication system having, for example, a channel spacing of $12\frac{1}{2}$ kHz. If the synthesizer frequency step is 100 kHz and, say, the fractional offset frequency is $12\frac{1}{2}$ kHz, then a spurious $12\frac{1}{2}$ kHz signal is produced which will be in the adjacent channel. Without special precautions, this signal would be 30 to 50 dB down with respect to the channel carrier but the CCITT specification requires it to be at least 90 dB down. This is readily achievable by the provision of the control signal having random or pseudo-random distribution.

If a pseudo-random binary sequence is used, which is generated in well known manner from and N-stage shift register with feedback, $2^N-1$ different codes are generated. Every code is complemented by another particular code except the all-1's code since there is no complementary all-0's code. Thus, there is a small imbalance once in every complete sequence of $2^N-1$ codes. If the sequence is generated, for example, by a shift register having $N=17$ stages clocked by a 1 MHz clock pulse, the total cycle length is $2^{17}-1=131071$ bits, i.e. a rate of 7.63 Hz. Thus, there will be a very small imbalance at this rate giving a small offset in the final frequency which, in many cases, will be acceptable. Alternatively, in this case, the imbalance may be eliminated entirely by the use of the Manchester code or a differentiated code.

If, for reasons of imperfect compensation, some residual energy from the pseudo-random binary sequence caused phase jitter, the sideband components of this jitter will be spaced at 7.63 Hz and, at that frequency spacing, the sideband energy becomes indistinguishable from white noise and is therefore substantially inaudible.

In the circuit so far described—that is without the provision of an automatic feedback circuit shown in heavy lines and including a correlator M—the gain of the gain-controlled amplifier GCA may be controlled, in a manner not shown, to be an inverse function of the frequency Fo. The reason for this is as follows.

In effect, the signal C has a value which predicts any phase delay resulting from jitter and compensates for this delay accordingly. As would be expected, as the offset frequency Fos is increased, so the amount of jitter per unit of time increases and the value of the jitter-compensating signal C increases. The average value of the signal B is zero, due to the removal of the d.c. content, and hence the signal C is a function of the amount of jitter caused by the pulse swallowing technique. However, the voltage step out of the phase comparator PC when a pulse is subtracted at the input to divider PD is proportional to the length of the pulse (i.e. one cycle of the VFO output frequency) and is therefore inversely proportional to the frequency Fo. Thus, in the above-mentioned case of a frequency synthesizer having a range of 1.6 MHz to 30 MHz, the amplitude of the signals dealt with by the jitter compensation circuit can vary if the synthesizer is switched from one end of its output frequency range to the other. This can cause inaccuracies in the jitter correction signal C and, to compensate for this, the gain-controlled amplifier GCA included in the correction signal circuit may have its gain controlled by a period-to-analog converter having the frequency Fo fed to its input. In this way, a very precise and accurate compensation for the effects of jitter is provided over the whole frequency range.

Preferably, however, the amplifier GCA forms part of an automatic feedback circuit, shown with heavy line connections, which further includes a correlator (detector) M. The signal input of correlator M is connected to the output of phase comparator PC and the reference input is connected to the output of adder ADD. The correlation signal output of correlator M controls the gain of amplifier GCA. In this manner, correlator M detects any residual jitter appearing at the output of phase comparator PC and varies the gain of amplifier GCA—and hence the amplitude of the correction signal C—to eliminate any residual jitter automatically.

While the amplifier GCA is shown preceding the removal circuit DCR, it will be evident to those skilled in the art that it may be located anywhere in the series circuit ADD-DCR-INT-PM.

From the above, it can be appreciated that the phase correction signals are derived in a very simple manner directly from the phase jitter actually in the offset frequency source OFS. Further, the correction steps are derived by analog means—in contradistinction to known systems which are based on digital means—with the result that the correction signal does not suffer from the discontinuities which can be introduced by inaccuracies of practical digital-to-analog converters which occur in known phase prediction methods.

In modern frequency synthesizers, there is a requirement for closely-spaced output frequencies and this results in large division ratios and small values of Fos for a given output frequency. This may result in unacceptable performance in terms of output noise and switching speed. The frequency synthesizer according to the invention, however, allows small frequency increments while at the same time having the noise and switching speed performance of a system with a considerably higher reference frequency $F_R$.

FIG. 2 shows a frequency synthesizer of the direct type, that is to say one in which a variable number of pulses from a reference frequency generator is cancelled in order to provide the required (lower) output frequency.

The synthesizer comprises, in sequence, a stable frequency source comprising a clock pulse generator CPG, a programmable divider DIV (if required) whose output comprises pulses having a repetition rate (frequency) Fr, a pulse adder PA, a pulse subtractor PS, a rate multiplier RM, a delay DL, a ramp generator RG having start and reset inputs S and R, respectively, and an analog comparator COM, the output of which constitutes the output frequency Fo of the synthesizer. The compensation signal circuit comprises a d.c. removal circuit DCR, an analog integrator INT, a divider DV, a gain-controlled amplifier GCA, and a summing circuit SUM. The multiplying factor of rate multiplier RM is controlled by an input signal n which also determines the division factor of divider DV. It further comprises a correlator M, a low pass filter F and a control device CD. The correlator M, filter F, and gain-controlled amplifier GCA form an optional automatic servo.

Ignoring for the moment the operation of the automatic servo M-F-GCA and assuming that the gain of amplifier GCA is unity, the operation of the circuit is as follows.

The operation of control device CD, pulse adder PA, and pulse subtractor PS is the same as that described with reference to FIG. 1; namely to provide a signal at the input to rate multiplier RM comprising the reference frequency Fr perturbed by added and subtracted cycles (pulses) under the control of device CD. Rate multiplier RM produces pulses at its output at an average rate given by $Frm = nFr$ where $0 < n \leq 1$ and assuming that the number of pulses added by the arrangement CD-PA-PS is the same over a given period as the number of pulses it subtracts. These output pulses are synchronized with the input pulses to rate multiplier RM and the extra jitter caused by the added and subtracted pulses appears at the input to d.c. removal circuit DCR together with the jitter caused by the rate multiplier RM. The output pulses of circuit DCR are integrated by analog integrator INT and the integrated signal is then divided by the rate multiplier control signal n in divider DV which may comprise in practice a multiplying digital-to-analog converter.

The output analog signal of divider DV is now proportional to the time advances required in the rate multiplier RM output in order to produce an evenly-spaced pulse train. However, because the ramp generator RG and comparator COM combination is only able to delay the rate multiplier output signals and not to advance them, it is necessary to offset the value of the output of divider DV by an analog voltage which represents one whole period ("1") of the clock pulses. This is effected by summing circuit SUM.

The production of evenly-spaced output pulses is as follows. An output pulse from the rate multiplier RM is delayed by delay DL for one clock period of Fr to allow time for the analog integration process to take place. This delayed pulse is then applied to the start input S of the ramp generator RG and causes generator RG to produce a ramp voltage at its output to the non-inverter (+) input of a comparator COM comprising, for example, a differential operational amplifier. The voltage proportional to the required delay is fed to the inverting (−) input of comparator COM from summing circuit SUM. When the ramp voltage reaches this delay voltage, the comparator output goes high and, in turn, resets the ramp generator via its input R. The synthesizer output thus consists of a very short output pulse from comparator COM. Further outputs from the rate multiplier RM are similarly delayed by the correct amount resulting in an evenly-spaced train of frequency $Fo = nFr$ at the comparator output, where $0 < n \leq 1$.

The summing circuit SUM, the ramp generator RG and comparator COM together constitute a programmable delay generator which is controlled by the compensation signal from divider DV such that the output pulses of the delay generator are respectively delayed by such an amount that the periods of occurrence are equal.

The operation of the automatic servo is closely similar to that of the servo described with reference to FIG. 1, namely, that the correlator M detects the sign or phase of any residual jitter in the output by correlating this jitter with a reference signal formed by the output of delay DL and uses this to control the amplitude of the compensation signal fed to the inverting input of comparator COM. The output of correlator M is integrated by low-pass filter F and the resulting analog signal controls the gain of gain-controlled amplifier GCA such that any residual jitter in the frequency Fo is reduced at least substantially to zero.

It is to be noted that the pulse addition and subtraction circuits PA and PS may alternatively be located in the path between rate multiplier RM and delay DL.

I claim:
1. A frequency synthesizer for providing an output signal having a frequency different from that of a signal having a given frequency by a selected offset frequency, comprising
a frequency control circuit, receiving said output signal or said signal having a given frequency as an input, for producing a reduced frequency pulse train having a frequency dependent on but less than the frequency of said one of said signals, said reduced frequency pulse train having jitter frequency components due to inequality in periods of time between successive pulses of the reduced frequency pulse train,
an output circuit, receiving said reduced frequency pulse train, and having an output which is said output signal, and
a jitter compensation circuit connected to said frequency control circuit for receiving a jitter-containing input therefrom, and providing an output connected to said output circuit for reducing jitter in the period of said output signal which would otherwise be caused as a result of said inequality,
characterized in that said jitter compensation circuit comprises an analog integrator, and a d.c. removal circuit, for removing any d.c. voltage from a signal representative of the jitter, said analog integrator filtering said signal representative of the jitter,
the synthesizer further includes a control device having at least one control signal output,
said frequency control circuit comprises means responsive to said at least one control signal output for canceling extra cycles from, and adding extra cycles to, said input, for reducing the relative strength of any spurious signal in said output signal resulting from imperfect compensation by said jitter compensation circuit, and
the synthesizer comprises a control signal compensation circuit connected to said control device, for compensating for jitter that would otherwise by caused by the control signal.

2. A synthesizer as claimed in claim 1, characterized in that said means responsive to said control signal output cancels extra cycles according to a first pulse sequence, and adds extra cycles according to a second pulse sequence, said first and second pulse sequences being interspersed.

3. A synthesizer as claimed in claim 2, characterized in that said first and second sequences together form a pseudo-random sequence.

4. A synthesizer as claimed in claim 1, comprising means for combining an output of said analog filter and an output of said control signal compensation circuit, to form a combined compensation signal.

5. A synthesizer as claimed in claim 4, characterized by comprising a detector arranged to detect any residual jitter remaining after application of said combined compensation signal, and a variable gain amplifier arranged for controlling the amplitude of said combined compensation signal, the gain of said amplifier being controlled by said detector to reduce said residual jitter.

6. A synthesizer as claimed in claim 1, characterized in that said frequency control circuit comprises a cycle cancellation circuit having an output and at least one input, said jitter-containing input being an input of said cycle cancellation circuit.

7. A synthesizer as claimed in claim 1, characterized in that said jitter-containing input is said reduced frequency pulse train.

8. A frequency synthesizer for providing an output signal having a frequency different from that of a signal having a given frequency by a selected offset frequency, comprising
   a pulse source for generating an offset pulse train having an average frequency equal to said selected offset frequency,
   a frequency control circuit, having an input, for producing a reduced frequency pulse train having a frequency less than said input, said frequency control circuit including a cycle cancellation circuit for canceling a cycle of said input for each pulse of said offset pulse train,
   an output circuit, receiving said reduced frequency pulse train, and having an output which is said output signal, and
   a jitter compensation circuit connected to said frequency control circuit and providing an output connected to said output circuit for reducing jitter in the period of said output signal which would otherwise be caused as a result of each cancelled cycle,
   characterized in that said output circuit comprises a variable frequency oscillator for generating said output signal, said output signal being said input to said frequency control circuit; and means for comparing said reduced frequency pulse train with said given signal, for varying the frequency of the variable frequency oscillator,
   said jitter compensation circuit comprises an analog integrator, and a d.c. removal circuit, for removing any d.c. voltage from a signal representative of the jitter resulting from cancellation of a cycle by said cycle cancellation circuit, said analog integrator filtering said signal representative of the jitter, and
   the synthesizer further includes a control device having at least one control signal output, and said frequency control circuit comprises means responsive to said at least one control signal output for canceling extra cycles from, and adding extra cycles to, said reduced frequency pulse train, for reducing the relative strength of any spurious signal in said output signal resulting from imperfect compensation by said jitter compensation circuit, and
   a control signal compensation circuit connected to said control device, for compensating for jitter that would otherwise be caused by the control signal.

9. A synthesizer as claimed in claim 8, characterized in that said cycle cancellation circuit forms part of said means responsive to said control signal output, and cancels said extra cycles; and said means responsive to said control signal output includes a pulse adder for adding pulses to the output of said cycle cancellation circuit.

10. A frequency synthesizer for providing an output signal having a frequency different from that of a given signal by a selected offset frequency, comprising
    means, including a reference frequency generator, for generating said given signal,
    a frequency control circuit, receiving said given signal as an input, for producing a reduced frequency pulse train having a frequency dependent on but less than the frequency of said given signal, said reduced frequency pulse train having jitter frequency components due to inequality in periods of time between successive pulses of the reduced frequency pulse train,
    an output circuit, receiving said reduced frequency pulse train, and having an output which is said output signal, and
    a jitter compensation circuit connected to said frequency control circuit and providing an output connected to said output circuit for reducing jitter in the period of said output signal which would otherwise be caused as a result of said inequality,
    characterized in that said jitter compensation circuit comprises an analog integrator, and a d.c. removal circuit, for removing any d.c. voltage from a signal representative of the jitter resulting from said inequality, said analog integrator filtering said signal representative of the jitter, and
    the synthesizer further includes a control device having at least one control signal output, and said frequency control circuit comprises means responsive to said at least one control signal output for canceling extra cycles from, and adding extra cycles to, said reduced frequency pulse train, for reducing the relative strength of any spurious signal in said output signal resulting from imperfect compensation by said jitter compensation circuit.

11. A synthesizer as claimed in claim 10, characterized in that said frequency control circuit comprises a rate multiplier.

12. A synthesizer as claimed in claim 11, characterized by comprising a feedback control system including a detector, a low-pass filter, and a gain controlled amplifier, said detector being arranged to detect any residual jitter in said output signal, said low-pass filter receiving an output from said detector and providing a gain controlling signal to said gain-controlled amplifier, said amplifier amplifying a signal received from said analog integrator.

13. A synthesizer as claimed in claim 12, characterized by comprising a ramp generator having a reset input, and an output, and
    a comparator having the output of said ramp generator connected as one input, and having an output which is said output signal and is connected to said reset input of said ramp generator, said comparator having another input receiving a signal derived from said gain controlled amplifier output.

14. A synthesizer as claimed in claim 11, characterized in that said means responsive to said control signal output cancels extra signals from, and adds extra signals to, said given signal, to form an input received by said rate multiplier.

15. A synthesizer as claimed in claim 10, characterized in that said means responsive to said control signal output cancels extra signals from, and adds extra signals to, said given signal.

* * * * *